United States Patent
Kueng et al.

(10) Patent No.: US 6,683,484 B1
(45) Date of Patent: Jan. 27, 2004

(54) COMBINED DIFFERENTIAL AND SINGLE-ENDED INPUT BUFFER

(75) Inventors: Jeffrey S. Kueng, New Brighton, MN (US); Justin J. Kraus, Chaska, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/324,284

(22) Filed: Dec. 19, 2002

(51) Int. Cl.$^7$ .................................................. H03F 3/45
(52) U.S. Cl. ..................... 327/307; 327/561; 330/259
(58) Field of Search ........................... 327/175, 379, 327/307, 305, 561; 330/268, 258, 259

(56) References Cited

U.S. PATENT DOCUMENTS

| | | | |
|---|---|---|---|
| 5,444,579 A | * | 8/1995 | Klein et al. .................. 330/305 |
| 5,798,664 A | * | 8/1998 | Nagahori et al. ............ 327/307 |
| 6,411,145 B1 | | 6/2002 | Kueng et al. ................ 327/175 |

FOREIGN PATENT DOCUMENTS

KR    2001087902    * 9/2001

* cited by examiner

*Primary Examiner*—Dinh T. Le
(74) *Attorney, Agent, or Firm*—Westman, Champlin & Kelly

(57) ABSTRACT

An integrated circuit input buffer is provided, which includes a differential buffer, first and second average value circuits and a feedback amplifier. The input buffer is selectively operable in a differential operating mode and a single-ended operating mode. The differential amplifier has first and second buffer inputs and first and second buffer outputs. The first and second average value circuits have inputs coupled to the first and second buffer outputs, respectively. The feedback amplifier has first and second differential inputs coupled to outputs of the first and second average value circuits, respectively, and has an amplifier output. The amplifier output is coupled to the second buffer input when the input buffer is in the single-ended operating mode and is decoupled from the second buffer input when the input buffer is in the differential operating mode.

20 Claims, 1 Drawing Sheet

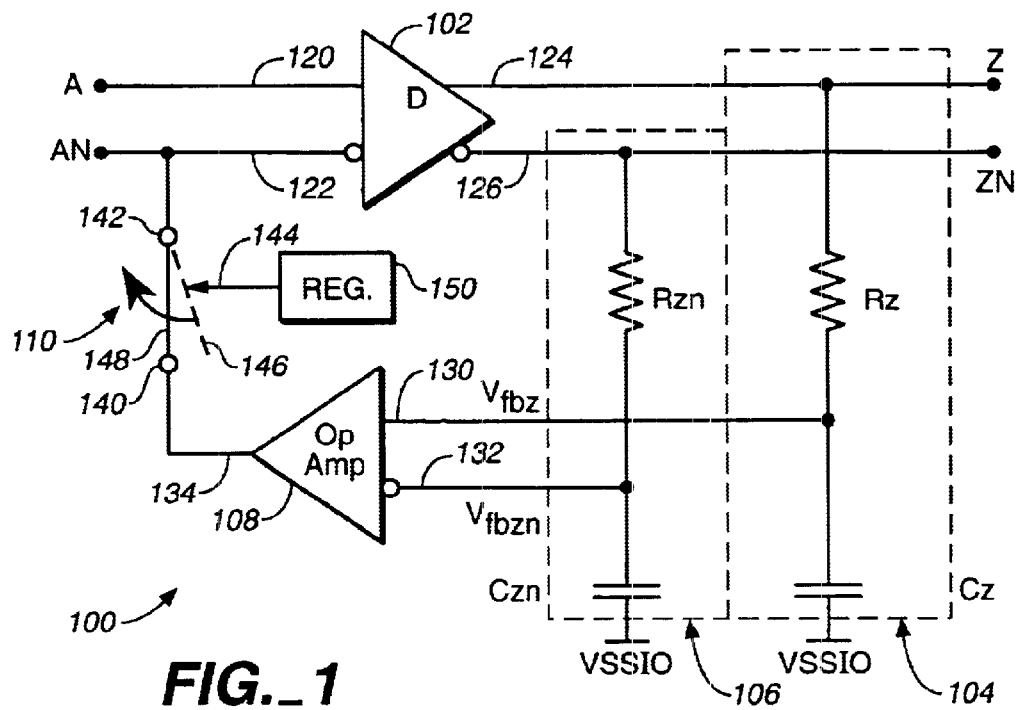
FIG._1
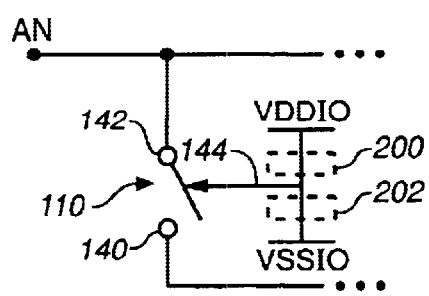
FIG._2
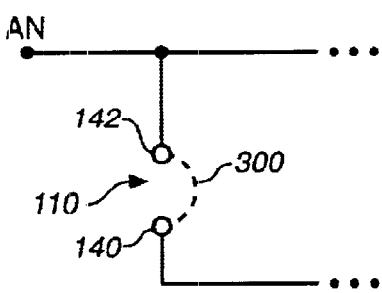
FIG._3
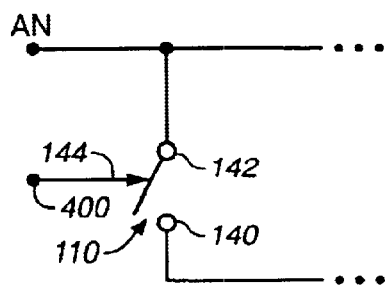
FIG._4
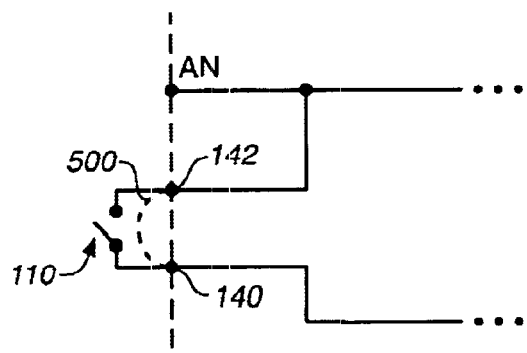
FIG._5

US 6,683,484 B1

COMBINED DIFFERENTIAL AND SINGLE-ENDED INPUT BUFFER

FIELD OF THE INVENTION

The present invention relates to semiconductor integrated circuits. More particularly, the present invention relates to integrated circuit input buffers.

BACKGROUND OF THE INVENTION

The input pins of an integrated circuit are coupled to input buffers for receiving input signals from off-chip. Depending on the application in which the integrated circuit is used, the input signal can be single-ended or differential. A single-ended signal represents data by the voltage level on the signal wire. This voltage level typically ranges from one voltage supply rail to the other. A differential input signal represents data by the relative voltages on two differential signal wires. Differential voltages are typically reduced significantly from the rail-to-rail voltage levels used by single-ended signals.

Is often desirable to provide an integrated circuit with the flexibility of operating with single-ended input signals or differential input signals. However, because the differential signaling levels are lower than the rail-to-rail signaling levels used by single-ended systems, most input buffers are designed to operate exclusively in either a single-ended mode or a differential mode. This limitation therefore requires an integrated circuit to be configured differently for receiving differential input signals than for receiving single-ended input signals.

For example, integrated phase-locked-loop (PLL) circuits use an external reference clock for high performance applications. The jitter performance of an integrated PLL is significantly impacted by jitter in the reference clock. A major component of reference clock jitter is noise that couples onto the wire bringing the reference clock from the input pin to the PLL phase detector. One method of minimizing the effects of noise coupling onto the reference clock line is to use a differential reference clock. While this method is often the best technical solution, it requires the use of differential oscillators, which are significantly more costly than standard single-ended oscillators. Thus, having an input buffer that can accept either a differential or a single-ended reference clock would provide the option of selecting either high performance or low cost.

There are two existing methods of providing the flexibility of accepting differential or single-ended input signals. The first is to design separate integrated circuits for differential and single-ended input signals, or to design a modular integrated circuit that can be customized by inserting a differential or single-ended input buffer depending on the application. The second method is to design the integrated circuit to accept only single-ended input signals and then implement an input level shifting network that generates an appropriate complementary signal from the single-ended input. However, these methods add additional complexity and cost.

Therefore, improved input buffers are desired, which are capable of accepting both differential and single-ended input signals.

SUMMARY OF THE INVENTION

One embodiment of the present invention comprises an integrated circuit input buffer, which includes a differential buffer, first and second average value circuits and a feedback amplifier and is selectively operable in a differential operating mode and a single-ended operating mode. The differential amplifier has first and second buffer inputs and first and second buffer outputs. The first and second average value circuits have inputs coupled to the first and second buffer outputs, respectively. The feedback amplifier has first and second differential inputs coupled to outputs of the first and second average value circuits, respectively, and has an amplifier output. The amplifier output is coupled to the second buffer input when the input buffer is in the single-ended operating mode and is decoupled from the second buffer input when the input buffer is in the differential operating mode.

Another embodiment of the present invention is directed to an integrated circuit input buffer, which includes a differential buffer, first and second average value circuits, a feedback amplifier and a switch. The differential buffer includes first and second buffer inputs and first and second buffer outputs. The first and second average value circuits have inputs coupled to the first and second buffer outputs, respectively. The feedback amplifier has first and second differential inputs coupled to outputs of the first and second average value circuits, respectively, and has an amplifier output. The switch selectively couples and decouples the amplifier output to and from the second buffer input and has a switch control input.

Another embodiment of the present invention is directed to an integrated circuit input buffer, which includes a signal input for receiving a single-ended input signal, a feedback output for providing a feedback signal, and a differential buffer having first and second buffer inputs and first and second buffer outputs. The first and second buffer inputs are coupled to the first signal input and the feedback output, respectively. A feedback circuit measures a difference between the average values of the first and second buffer outputs and sets a voltage of the feedback signal such that the difference is reduced.

BRIEF DESCRIPTION OF THE DRAWINGS

FIG. 1 is a schematic diagram illustrating an input buffer having a differential/single-ended input and a differential output, according to one embodiment of the present invention.

FIG. 2 is a schematic diagram illustrating a portion of buffer 100 according to an alternative embodiment of the present invention.

FIG. 3 is a schematic diagram illustrating a portion of buffer 100 according to another alternative embodiment of the present invention.

FIG. 4 is a schematic diagram illustrating a portion of buffer 100 according to another alternative embodiment of the present invention.

FIG. 5 is a schematic diagram illustrating a portion of buffer 100 according to another alternative embodiment of the present invention.

DETAILED DESCRIPTION OF ILLUSTRATIVE EMBODIMENTS

FIG. 1 is a schematic diagram illustrating an input buffer 100 according to one embodiment of the present invention. Input buffer 100 includes differential inputs A and AN, differential outputs Z and ZN, a differential buffer or amplifier 102, average value circuits 104 and 106, a feedback amplifier 108 and a switch 110.

Buffer 100 is configured to receive either differential input signals on inputs A and AN or single-ended input signals on input A. In either case, input buffer 100 generates corresponding complementary signals on outputs Z and ZN for use by the internal components of the integrated circuit.

Inputs A and AN can be directly coupled to pins of the integrated circuit on which buffer 100 is fabricated or can be coupled to the pins through one or more intermediate components. Inputs A and AN are coupled to inputs 120 and 122 of differential buffer 102. In this embodiment, input 120 is a non-inverting input and input 122 is an inverting input. Differential buffer 102 has outputs 124 and 126, which are coupled to Z and ZN, respectively.

In the embodiment shown in FIG. 1, average value circuit 104 includes a low-pass filter formed by resistor RZ and capacitor CZ, which are coupled in series with one another between output Z and voltage supply terminal VSSIO. Similarly, average value circuit 106 includes a low-pass filter formed by resistor RZN and capacitor CZN, which are coupled in series with one another between output ZN and voltage supply terminal VSSIO. Voltage supply terminal VSSIO is a relatively negative voltage supply terminal within the input-output area of the integrated circuit. However, any suitable voltage supply terminal can be used. The outputs of average value circuits 104 and 106 generate feedback voltages $V_{FBZ}$ and $V_{FBZN}$, respectively, which are applied to differential inputs 130 and 132 of feedback amplifier 108.

In one embodiment, feedback amplifier 108 includes an operational amplifier. However, other types of amplifiers can also be used such as a differential amplifier with appropriate voltage level shifting. Feedback amplifier 108 has a feedback output 134, which is coupled to a first terminal 140 of switch 110. The second terminal 142 of switch 110 is coupled to input AN. Switch 110 has an open state 146 and a closed state 148, which are controlled by switch control input 144. Switch 110 selectively couples feedback output 134 to input AN when in the closed state 148 and decouples feedback output 134 from input AN when in the open state 146.

Switch 110 can include one or more transistors, for example, which are fabricated on the same integrated circuit as buffer 110. In one embodiment, switch 110 includes a single transistor. In another embodiment, switch 110 includes a pass gate formed by two transistors. An operating mode control register 150 is coupled to switch control input 144 for setting the state of switch 110. The logic state that is loaded into register 150 determines whether switch 110 is in the open state 146 or the closed state 148. Register 150 is loaded with a different state, depending on whether buffer 100 is to be configured to receive differential input signals or single-ended input signals. Register 150 can be loaded during power-up of the integrated circuit or at any other time during operation. For example, register 150 can be loaded as part of a serial scan chain within the integrated circuit.

Input buffer 100 can receive either a differential input voltage ($V_A$-$V_{AN}$) or a single-ended voltage ($V_A$). In either case, buffer 100 generates a differential output voltage ($V_Z$-$V_{ZN}$). In the differential operating mode, switch 110 is set to the open state 146, and the differential input signal ($V_{A-VAN}$) is amplified by buffer 102 to create a differential output signal ($V_Z$-$V_{ZN}$) on outputs Z and ZN.

The single-ended operating mode is based on the observation that a differential buffer can be operated in a single-ended mode by connecting one input pin of the buffer to a fixed voltage and driving the other input pin with a single-ended signal. However, buffer 100 allows the voltage on AN to vary with the voltage on A in order to operate properly for a wide range of single-ended input signals.

In the single-ended operating mode, switch 110 is set to the closed state 148 creating a closed-loop negative feedback path through average value circuits 104 and 106 and feedback amplifier 108. Average value circuits 104 and 106 filter the signals generated on outputs Z and ZN. The filtered feedback voltages $V_{FBZ}$ and $V_{FBZN}$ represent the average values of the voltages on outputs Z and ZN. These average values are proportional to the duty cycles on Z and ZN. A duty cycle is the proportion of time during which each output signal is in a logic high state or a logic low state. The difference between $V_{FBZ}$ and $V_{FBZN}$ represents the amount of mismatch between the duty cycles on outputs Z and ZN.

Feedback amplifier 108 amplifies the mismatch voltage ($V_{FBZ}$-$V_{FBZN}$) and causes the feedback voltage 134 to change in the direction required to reduce the mismatch and therefore the average value variation. Buffer 100 reaches a steady state when feedback amplifier 108 has adjusted the voltage on AN to a voltage that allows buffer 102 to produce output voltages on Z and ZN with substantially 50 percent duty cycles.

Buffer 100 therefore measures the difference in average value between output voltages Z and ZN and uses negative feedback to automatically set the voltage on AN to whatever value is needed to produce a 50/50 duty cycle on outputs Z and ZN, regardless of the waveform applied to input A.

The input buffer shown in FIG. 1 can therefore be modified to accept either a normal differential input or a single-ended input of any input range, from zero to the supply voltage of the integrated circuit, by simply setting the state of switch 110. This type of buffer allows a great deal of flexibility in application. The same integrated circuit and buffer instances can be used in multiple applications without incurring the additional cost and engineering that would otherwise be required to design multiple add-on networks for accepting a single-ended input signal or to design separate circuits.

In alternative embodiments, average value circuits 104 and 106 can include any other circuits that generate signals (for example, voltages) having characteristics representative of the average values on the outputs of buffer 102. For example, the passive low-pass filters shown in FIG. 1 can be replaced with active low-pass filters or integrators.

FIGS. 2–4 are diagrams illustrating a portion of buffer 100 according to further alternative embodiments of the present invention. The same reference numerals are used in FIGS. 2–4 as where used in FIG. 1 for the same or similar elements. In FIG. 2, switch control input 144 is coupled to either power supply rail VDDIO or ground supply rail VSSIO through elements 200 and 202. Elements 200 and 202 can include fusible links or pass gates, for example. Any other suitable reference voltage can also be used. Alternatively, elements 200 and 202 can be eliminated routing the wire that connects to switch control input 144 directly to one supply rail or the other. In FIG. 3, the switch 110, itself, is implemented as a fusible link 300 within the integrated circuit.

In FIG. 4, switch control input 144 is coupled to one of the external pins 400 of the integrated circuit on which buffer 100 is fabricated. This embodiment allows an external signal to control the operating mode of buffer 100.

In FIG. 5, terminals 140 and 142 are external pins of the integrated circuit on which buffer 100 is fabricated. Switch 110 is an external component that is coupled to pins 140 and 142. Alternatively, a jumper wire 500 can be selectively coupled between pins 140 and 142. Other configurations can also be used. Any circuit elements can be used to selectively couple and decouple feedback output 134 to and from input AN.

Although the present invention has been described with reference to preferred embodiments, workers skilled in the art will recognize that changes may be made in form and detail without departing from the spirit and scope of the invention. For example, the term "coupled" can include various types of connections or couplings and can include a direct connection or a connection through one or more intermediate components. Also, the various embodiments can be inverted. The voltage supply terminals can include any voltage reference terminals, whether biased to the same voltage as the main voltage supply rails or to an intermediate voltage.

What is claimed is:

1. An integrated circuit input buffer comprising:
   a differential buffer comprising first and second buffer inputs and first and second buffer outputs;
   an operating mode, which is selectable between a differential operating mode and a single-ended operating mode;
   first and second average value circuits having inputs coupled to the first and second buffer outputs, respectively;
   a feedback amplifier having first and second differential inputs coupled to outputs of the first and second average value circuits, respectively, and having an amplifier output; and
   a coupling element between the amplifier output and the second buffer input, wherein the amplifier output is coupled to the second buffer input by the coupling element when the input buffer is in the single-ended operating mode and decoupled from the second buffer input by the coupling element when the input buffer is in the differential operating mode.

2. The integrated circuit input buffer of claim 1 wherein the first and second average value circuits each comprises a low pass filter.

3. The integrated circuit input buffer of claim 1 wherein the feedback amplifier comprises an operational amplifier.

4. The integrated circuit input buffer of claim 1 wherein the feedback amplifier comprises a differential amplifier.

5. The integrated circuit input buffer of claim 1 wherein the coupling element comprises:
   a switch coupled in series between the feedback amplifier output and the second buffer input and having a switch control terminal, wherein the switch has an open state in the differential operating mode and a closed state in the single-ended operating mode.

6. The integrated circuit input buffer of claim 5 and further comprising:
   an operating mode control register having an output coupled to the switch control input.

7. The integrated circuit input buffer of claim 5 and further comprising:
   an input pin of an integrated circuit on which the input buffer is fabricated, wherein the input pin is coupled to the switch control input.

8. The integrated circuit input buffer of claim 5 and further comprising:
   a voltage supply terminal, wherein the switch control input is selectively coupled to the voltage supply terminal.

9. The integrated circuit input buffer of claim 1 and further comprising:
   a first and second input pins of an integrated circuit on which the input buffer is fabricated, wherein the first input pin is coupled to the amplifier output and the second input pin is coupled to the second buffer input, and wherein the first and second input pins are selectively coupled to one another when the input buffer is in the single-ended operating mode and decoupled from one another when the input buffer is in the differential operating mode.

10. The integrated circuit input buffer of claim 1 and further comprising a fuse coupled between the amplifier output and the second buffer input.

11. An integrated circuit input buffer comprising:
    a differential buffer comprising first and second buffer inputs and first and second buffer outputs;
    first and second average value circuits having inputs coupled to the first and second buffer outputs, respectively;
    a feedback amplifier having first and second differential inputs coupled to outputs of the first and second average value circuits, respectively, and having an amplifier output; and
    a switch, which selectively couples and decouples the amplifier output to and from the second buffer input and has a switch control input.

12. The integrated circuit input buffer of claim 11 wherein the first and second average value circuits each comprises a low pass filter.

13. The integrated circuit input buffer of claim 11 wherein the feedback amplifier comprises an operational amplifier.

14. The integrated circuit input buffer of claim 11 wherein the feedback amplifier comprises a differential amplifier.

15. The integrated circuit input buffer of claim 11 and further comprising:
    an operating mode control register having an output coupled to the switch control input.

16. The integrated circuit input buffer of claim 11 and further comprising:
    an input pin of an integrated circuit on which the input buffer is fabricated, wherein the input pin is coupled to the switch control input.

17. The integrated circuit input buffer of claim 11 and further comprising:
    a voltage supply terminal, wherein the switch control input is selectively coupled to the voltage supply terminal.

18. An integrated circuit input buffer comprising:
    a first signal input;
    a differential buffer comprising first and second buffer inputs and first and second buffer outputs, wherein the first buffer input is coupled to the first signal input; and
    feedback means for measuring a difference between average values of the first and second buffer outputs, generating a feedback output, which is coupled to the second buffer input, and setting a voltage on the feedback output such that the difference is reduced, whereby single-ended input signals received on the first signal input are converted to differential signals having equal average values on the first and second buffer outputs.

19. The integrated circuit input buffer of claim 18 wherein first and second buffer inputs have equal average values in a steady state.

20. The integrated circuit input buffer of claim 18 and further comprising:
- a second signal input, wherein the first and second signal inputs together form differential inputs when a differential signal is received on the first and second signal inputs;
- a single-ended operating mode and a differential operating mode; and
- means for selectively coupling the feedback output to the second buffer input when the input buffer is in the single-ended operating mode and for decoupling the feedback output from the second buffer input when the input buffer is in the differential operating mode.

* * * * *